United States Patent
Lin et al.

[11] Patent Number: 5,850,171
[45] Date of Patent: Dec. 15, 1998

[54] PROCESS FOR MANUFACTURING RESISTOR-NETWORKS WITH HIGHER CIRCUIT DENSITY, SMALLER INPUT/OUTPUT PITCHES, AND LOWER PRECISION TOLERANCE

[75] Inventors: Barry Lin, Kaohsiung; Shih Chang Liao, Bao Shan Hsian; Duen Jen Cheng, Kaohsiung Hsien, all of Taiwan

[73] Assignee: CYNTEC Company, Hsinchu, Taiwan

[21] Appl. No.: 692,449

[22] Filed: Aug. 5, 1996

[51] Int. Cl.$^6$ ............................... H01C 1/01; H01C 1/14
[52] U.S. Cl. ............................................. 338/320; 338/322
[58] Field of Search ..................................... 338/320, 309, 338/322, 319, 312, 314

[56] References Cited

U.S. PATENT DOCUMENTS

| | | | |
|---|---|---|---|
| 3,601,745 | 8/1971 | Helgeland | 338/309 X |
| 4,199,745 | 4/1980 | Barry | 338/320 |
| 4,486,738 | 12/1984 | Sadlo et al. | 338/320 |
| 5,331,305 | 7/1994 | Kanbara et al. | 338/309 X |
| 5,334,968 | 8/1994 | Negoro | 338/320 |
| 5,379,190 | 1/1995 | Hanamura et al. | 338/320 X |
| 5,450,055 | 9/1995 | Doi | 338/309 X |
| 5,521,576 | 5/1996 | Collins | 338/309 X |

FOREIGN PATENT DOCUMENTS

| 404053201 | 2/1992 | Japan | H01C 7/00 |
|---|---|---|---|

*Primary Examiner*—Peter S. Wong
*Assistant Examiner*—K. Shin
*Attorney, Agent, or Firm*—Bo-In Lin

[57] ABSTRACT

The present invention discloses a resistive circuit. The resistive circuit includes a plurality of resistor networks disposed on a substrate. The resistor networks also includes a plurality of resistive circuit elements. The resistor networks further includes a plurality of termination contacts each connected to one of the resistive circuit elements. Each of the termination contacts is disposed on an edge of the substrate and each of the termination contacts is separated from a next termination contact by an edge trench disposed on the edge of the substrate whereby a distance across the edge trench defining a pitch between the termination contacts.

11 Claims, 5 Drawing Sheets

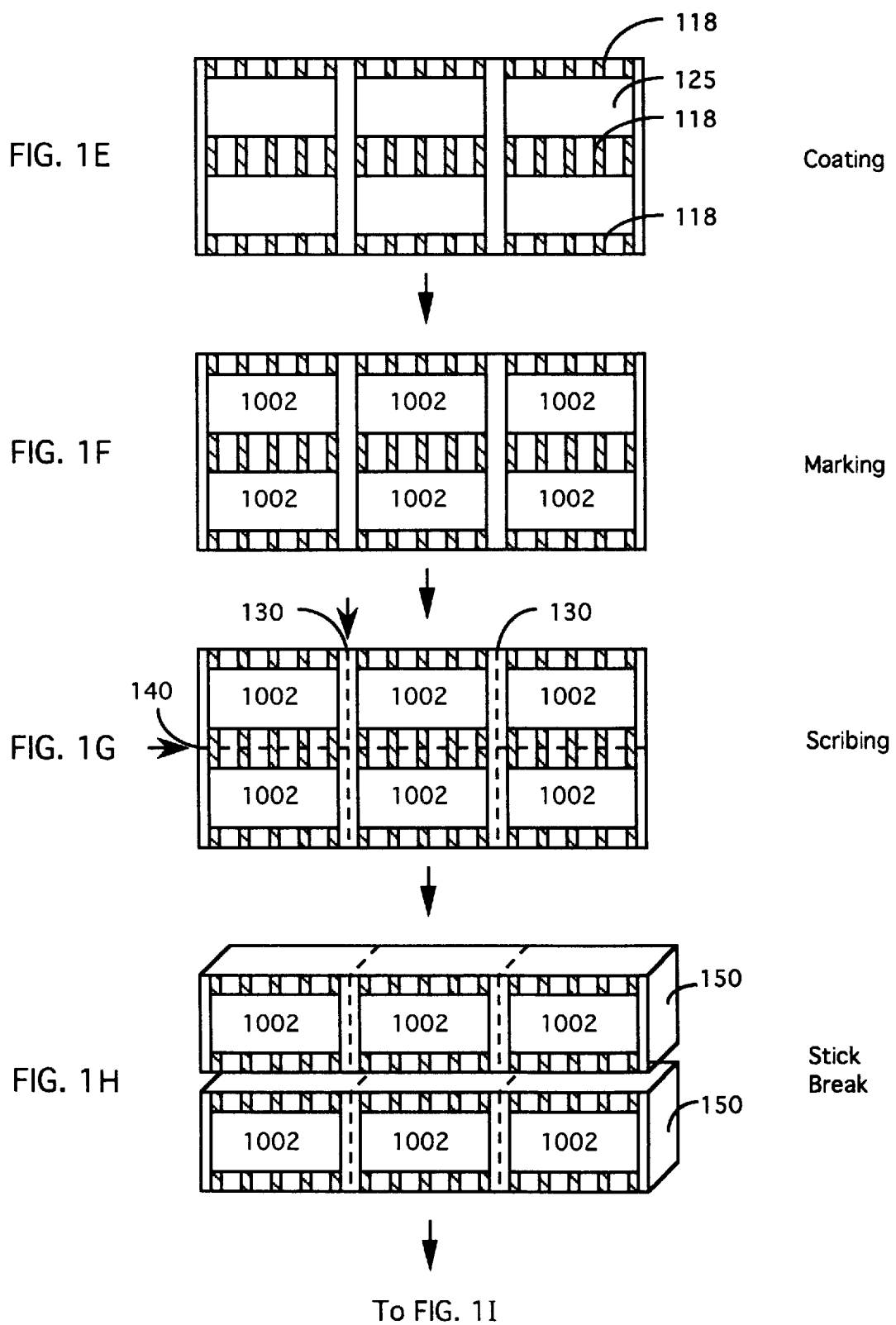

Side Edge Termination

Side Slicing

Chip Break

PROCESS FOR MANUFACTURING RESISTOR-NETWORKS WITH HIGHER CIRCUIT DENSITY, SMALLER INPUT/ OUTPUT PITCHES, AND LOWER PRECISION TOLERANCE

BACKGROUND OF THE INVENTION

1. Field of the Invention

This invention relates generally to the structure and fabrication process of resistor-network. More particularly, this invention relates to the structure and fabrication process for producing miniaturized and high density resistor-network on chip.

2. Description of the Prior Art

Further miniaturization of the micro-electronic packages are limited by a major bottleneck due to the difficulties now encountered by those of ordinary skill in the art in an effort in attempting to further reduce the size and the input/output (I/O) pitches of the micro-resistor-networks. For the active electronic devices, e.g., shifters, switches, filters, amplifiers, etc., rapid advancements are made in technology of miniaturization for fabricating and packaging as these electronic components are integrated on a very high density integrated circuit (IC) chip. In comparison, much slower technological progresses are accomplished for passive electrical elements, e.g., resistors, capacitors, and inductors. The difficulties in further miniaturization experienced in these passive electronic components often become the limitations to further shrinking down the size of an electronic devices. Driven by the technological advancements made in the active electronic components, the requirements of miniaturization of device packaging becomes more stringent and the spacing between input/output (I/O) pins are further decreased. The I/O pitches are reduced from 50 mils to 25, 20 and now even 15 mils and are moving to ever smaller dimensions. In order to be compatible to the reduced pitches, corresponding reduction are also required for the micro-resistors which are most frequently manufactured as resistor-networks. However, conventional techniques for fabricating the resistor-networks, even driven by the trend of miniaturization of the micro-electronic devices, cannot satisfy this reduced pitch requirements.

In addition to the difficulties associated with size and I/O pitch reduction, in order to be compatible with the performance level of other modern electronic components, the resistor-networks must be manufactured with high precision such that the tolerances of resistance-variation can be controlled within certain limits. Conventional techniques, as will be reviewed below, cannot satisfy the accuracy requirements, particularly, when constrained by the additional limitations that these resistor-networks have to be manufactured with very small sizes. Furthermore, as will be explained below, by applying the conventional manufacture processes, the manufacture costs for the resistor networks are increased when higher accuracy requirements or smaller pitch are applied due to the need to perform the sorting processes to reject the resistor networks which do not comply with the more stringent product specifications.

Current trend of miniaturizing electronic devices and circuits imposes a great demand to reduce the size and pitches of the resistor networks for implementation of these resistor network on the micro-electronic devices. The size of the resistors is continuously being reduced from a standard of EIA-1206 in the past, then progressively to EIA-0805 and EIA-0603, and now finally to a current standard of EIA-0402. Additionally, the original EIA-1206 standard requires four resistors to provide eight pins for external connection, in contrast, the EIA-1206 resistor now requires eight resistors to provide ten-pins. Modern electronic devices and circuits also demand higher degree of integration. The traditional techniques of resistor networks manufacture by the use of print circuit processes are no longer adequate. Even some of the resistors can still be manufactured by the use of conventional print circuit processes, however, due to the higher requirements on size and pin counts, the production yield is decreased. Some of the resistors are now manufactured by the use of thin film process. However, in order to apply thin film processes, expensive fabrication equipment is required, which may not be practical for many manufacturers of the resistive circuits.

In general, there are three kinds of techniques in manufacturing and packaging resistor-networks to be implemented in micro-electronics. The first type is the single in-line packaging (SIP) or dual in-line packaging (DIP) resistor networks. It applies a through-hole packaging technique on a ceramic substrate where the resistor networks are formed with either thin film or thick film technology. The input/output pins are employing a metal frame structure attached to the resistor networks. A protective coating is formed with dipping or molding processes. The I/O pins are then formed by cutting of the metal frame to form the pins. In this type manufacture process, the pitch and its precision of the I/O pins are limited by the metal frame structure in forming the I/O pins which becomes a limiting factor in size reduction. Additionally, due to the larger size of packages, resistor networks manufactured by this packaging technique is becoming obsolete when smaller resistor networks are required for micro-electronic implementation.

The second type of packaging technique is the small out-line (SO) or small outline packaging (SOP) for manufacturing resistor network for micro-electronic applications. A surface mount technology (SMT) is applied in this type of package where the resistor network is manufactured on a chip and the resistor network is then connected to a lead frame by applying the wire bonding connection. This package technique has an advantage over that of SIP or DIP because the pitch of the lead frame can be more precisely controlled at a smaller range by the use of wire bonding processes. However, due to the requirements of applying wire bonding and molding, the size of the package containing the resistor network is still quite large. Furthermore, in comparison with the chip-resistor network as discussed below, since the SOP resistor network employs the wire bonding process and includes extra plastic package, SOP resistor network is at least an order of magnitude more costly then the chip resistor-networks. SO or SOP resistor networks present another limitations that the smallest I/O pitch which can be achieved by these techniques are limited to approximately 25 mils. Due to the high cost and their larger size, SO or SOP types of resistor networks are gradually becoming more and more unpopular in the competitive market.

The third type is the chip-type resistor networks which are manufactured on a pre-formed ceramic substrate. Because of its low costs and the manufacturability to reduce the I/O pitch to 25 to 32 mils, this type of resistor-networks now dominates the market-place. The substrate is formed with arrays of pre-punched through-holes or pre-scribed marked-line for breaking and dividing the processed substrate into small resistor networks. Due to the uneven expansion of the substrate when high temperature cycles are applied in the processing steps, accurate pitch positions of the resistor networks cannot be controlled with sufficient precision as some of the pre-punched through holes may become unevenly distributed. A pre-sorting process has to be performed to reject the substrate which has punched through-holes which are unevenly distributed with position deviations exceed the tolerance limits. The pitch of this type of resistor networks are limited to 25 to 32 mils. Due to this extra pre-sorting step to select pre-formed substrate, the production time and costs are increased. This type of resistor networks are also limited to a accuracy of 1.0–5.0% resistance variations due to the temperature cycles required in the manufacture processes. Furthermore, due to the difficulty of contamination, the process is generally not compatible with thin film process. Larger size of areas are required to perform the thick film printing processes and to trim the resistor networks. The greater area-requirement in performing the thick film printing process thus limits the density of the resistor networks. Further reduction of the I/O pitches for this type of resistor networks are very difficult due to intrinsic limitations of employing pre-formed substrate and the thick film process.

Therefore, there is still a need in the art of to provide a new method of manufacture and resistor network configuration to overcome these limitations and difficulties. Preferably, more precise control for manufacturing smaller I/O pitches must be provided in the new manufacture method for the resistor network such that the difficulties of the prior art may be resolved. Additionally, the method of manufacture must be simple and can be conveniently automated such that large volumes of resistor networks can be mass produced with simple and easily controllable processes to reduced the production cost.

SUMMARY OF THE PRESENT INVENTION

It is therefore an object of the present invention to provide a new manufacture process and resistor network structure to overcome the aforementioned difficulties encountered in the prior art.

Specifically, it is an object of the present invention to provide a new manufacture process and a resistor network structure wherein the pitch of the I/O termination contacts are controlled by mechanically cutting a plurality of separating trenches between the I/O contacts thus producing I/O contacts with a pitch defined by the width across the pitch.

Another object of the present invention is to provide a new manufacture process and a resistor network structure wherein the resistor network can be further miniaturized and manufactured with higher density.

Another object of the present invention is to provide a new manufacture process and a resistor network structure wherein the resistor networks can be manufactured with simplified packaging process thus greatly reducing production costs.

Another object of the present invention is to provide a new manufacture process and a resistor network structure wherein the resistor networks can be manufactured with simplified processing and packaging procedures such that the manufacture process can be conveniently automated.

Briefly, in a preferred embodiment, the present invention comprises a resistive circuit. The resistive circuit includes a plurality of resistor networks disposed on a substrate. The resistor networks also includes a plurality of resistive circuit elements. The resistor networks further includes a plurality of termination contacts each connected to one of the resistive circuit elements. Each of the termination contacts is disposed on an edge of the substrate and each of the termination contacts is separated from a next termination contact by an edge trench disposed on the edge of the substrate whereby a distance across the edge trench defining a pitch between the termination contacts. In a preferred embodiment, the pitch defined by the edge trenches ranges from approximately ten mils to about fifty mils. In yet another preferred embodiment, the resistive circuit element composed of a layer of NiCr and the termination contacts composed of a layer of conductive NiCu. In yet another preferred embodiment, each of resistive circuit elements occupies an area substantially smaller than 0.7 mm$^2$ on the substrate.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 1A to 1K shows the processing steps of manufacturing a resistor network of the present invention by the use of thin film technology;

DETAILED DESCRIPTION OF THE PREFERRED EMBODIMENT

Figure 1A:
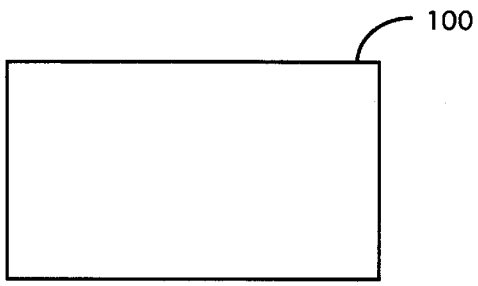
Figure 1B:
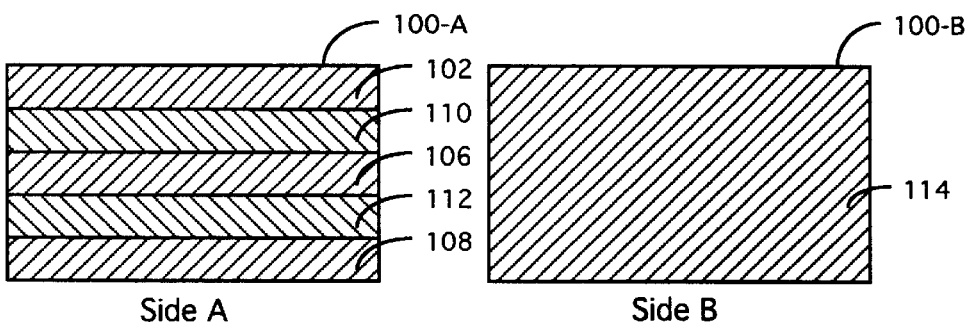
Figure 1C:
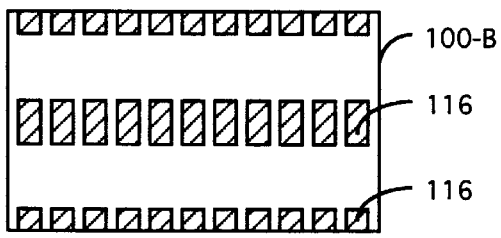
Figure 1D:
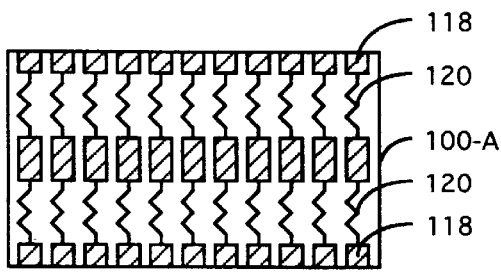

Please refer to FIGS. 1A to 1K for the processing steps for applying a thin film process to manufacture a miniaturized resistor network of the present invention. FIG. 1A shows a substrate 100 which is preferably a substrate composed of an aluminum dioxide. The substrate 100 is first cleaned and prepared for forming the resistor network thereon. In FIG. 1B, a thin film sputtering process is performed on both sides, i.e., side A 100-A and side B 100-B, of the substrate 100. On side A, two rows of resistive thin film 110 and 112 composed of NiCr and three rows of conductive films 102, 106, and 108 composed of NiCu for electric contacts are formed. The number of rows as shown in the FIGS. 1B are just for illustration, multiple rows are formed instead of two or three rows as shown in the actual manufacture processes. On side B, a layer of conductive film 114 composed preferably of NiCu is formed. In FIG. 1C, an electrode patterning process is performed on the side B of the substrate 100-B to form a plurality of electrodes 116 thereon. In FIG. 1D, a plurality of electrodes 118 are defined by patterning the electrode film 102, 106 and 108 and a plurality of resistors 120 are defined by patterning the resistive film 110 and 112 for connection between these electrodes 118. The substrate 100 with the electrodes 116, and 118 and the resistor 120 are annealed in an inert gas at a temperature of about 450° C. to 550° C. After the annealing process, a laser trim is performed to adjust the resistance of the resistors 120 formed on side A 100-A.

Figure 1I:
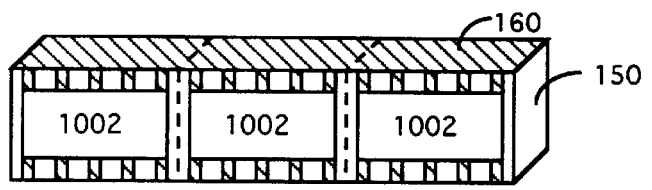
Figure 1J:
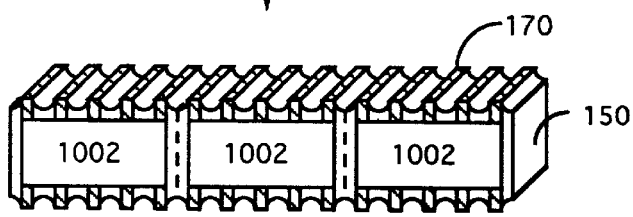
Figure 1K:
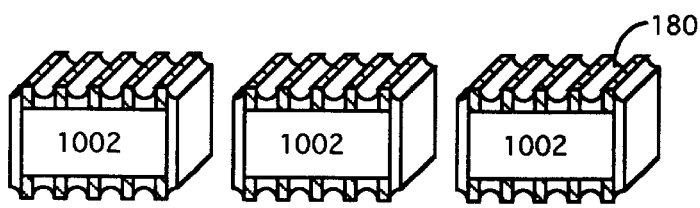

In FIG. 1E, a protective coating 125 is formed on top of the resistors 120 to protective the resistors 120 and in FIG. 1F, a marking, e.g., "1002", is printed on the protective layer 125 to identify the resistor network. In FIG. 1G, a scribing process is performed by the use of laser beam to cut the vertical pre-scribed lines 130 and horizontal pre-scribed lines 140. As will be explained below, a plurality of miniaturized resistor networks can be produced by breaking and dividing the substrate 100 into small resistor-network units along these pre-scribed lines 130 and 140. In FIG. 1H, along the horizontal pre-scribed lines 140, a "stick break" process is first carried out to break the substrate 100 into a plurality of horizontal sticks 150. In FIG. 1I a sputtering process is performed to form a side-edge conductive thin film 160 on the side-edges of each horizontal stick 150. The side-edge conductive thin film is implemented for electrically connecting the circuit elements on side A and B of the substrate, i.e., for connecting 100-A and 100-B. With the side-edge conductive film 160 formed on the edge side connecting side A and side B, a special edge trench cutting process is carried out to cut a plurality of edge trenches 170. The edge trenches 170 thus separate the edge conductive thin film 160 into a plurality of termination contacts connecting the resistor networks on side A 100-A to the electrode contacts 116 patterned on side-B 100-B. The trench cutting process can be accurately carried out by either laser beam or high precision cutting machine. The pitch between the termination contacts of the resistor networks, i.e., the width of the trenches, can be reduced to a distance as low as 10 mils. After the trench-cutting process is performed on the edge, a chip break process is carried out to break the substrate into a plurality resistor network chips 180 as that shown in FIG. 1K.

Therefore, the present invention discloses a method fabricating a plurality resistor networks 120 on a substrate 100 with each of the networks 120 connected to a termination contact 118 on the substrate 100. The method includes the steps of (a) forming a plurality of resistive films 110 and conductive films 102 on the substrate; (b) patterning the resistive films 110 into a plurality of resistive circuit elements 120 and a plurality of termination contacts 102, each connected to one of the resistive circuit elements 120; (c) cutting the substrate along a cutting edge with the cutting edge near a plurality of termination contacts 118; and (d) cutting a plurality of edge trenches 170 along the cutting edge each of the edge trenches 170 is cut between the termination contacts 118 thus separating the termination contacts 118 with a predefined pitch across said edge trenches 170 whereby precision control of the pitch between the termination contacts 118 can be controlled same as a precision control of cutting the edge trenches 170.

Furthermore, the present invention discloses a resistive circuit. The resistive circuit includes a plurality of resistor networks disposed on a substrate 100. The resistor networks also includes a plurality of resistive circuit elements 120. The resistor networks further includes a plurality of termination contacts 118 each connected to one of the resistive circuit elements 120. Each of the termination contacts 118 is disposed on an edge of the substrate 100 and each of the termination contacts 118 is separated from a next termination contact by an edge trench 170 disposed on the edge of the substrate 100 whereby a distance across the edge trench 170 defining a pitch between the termination contacts 118. In a preferred embodiment, the pitch defined by the edge trenches 170 ranges from approximately ten mils to about fifty mils. In yet another preferred embodiment, the resistive circuit elements 120 composed of a layer of NiCr and the termination contacts 118 composed of a layer of conductive NiCu. In yet another preferred embodiment, each of resistive circuit elements 120 occupies an area substantially smaller than 0.7 mm² on the substrate 100.

The miniaturized resistor networks of the present invention can also be manufactured by a thick film process. FIG. 2A shows a cross sectional view of a resistive element 200 formed on a substrate 205. A resistive layer 210 is first printed on the top surface of the substrate 205. A conductive film 220 is then printed on top of the resistive layer 210. The conductive layer 220 is implemented as an electrode for the resistive element 200 for connecting the resistive film 210 to other resistive elements to form the resistor network. By printing the conductive electrode layer 220 on top of the resistive layer 210, the length of the overlapping area between the conductive electrode layer 220 and the resistive layer 210 can be controlled and minimized to shrink the resistive element 205 and to increase the density of the resistor networks formed on the substrate 205. For the purpose of comparison, FIGS. 2A and 2B show the advantage of making a smaller resistor network element in printing the resistive film first below the conductive film (FIG. 2A) compared to that resistor network element when the resistive layer is printed above the conductive layer (FIG. 2B). Suppose that the length of the conductive layer exposed for making external contact is Lc and Lc is fixed. The length of the overcoat is $L_{ot}$ and the length of the exposed resistive layer is Lr and the length of the overlap between the resistive layer and the conductive layer is Lp. The length of the first resistive element shown in FIG. 2A is $$L_I=2Lc+L_{ot}=2Lc+(2Lp+Lr)$$

and the length of the second resistive element as shown in FIG. 2B is $$L_{II}=2Lc+L'_{ot}=2Lc+(2Lp+2Lp+Lr)=2Lc+(4Lp+Lr)$$

and $$L_{II}-L_I=L'_{ot}-L_{ot}=2Lp$$

Figure 2:
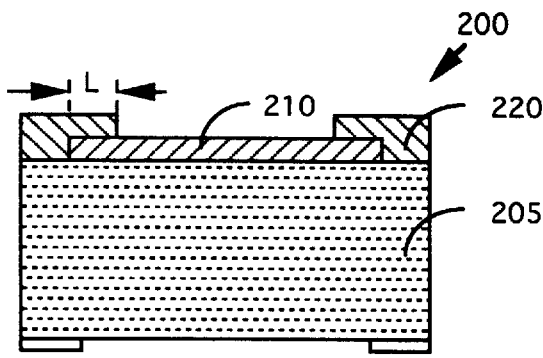
FIG. 2 shows a cross sectional view of a resistive element of the present invention applying a thick film printing process.
Figure 2A:
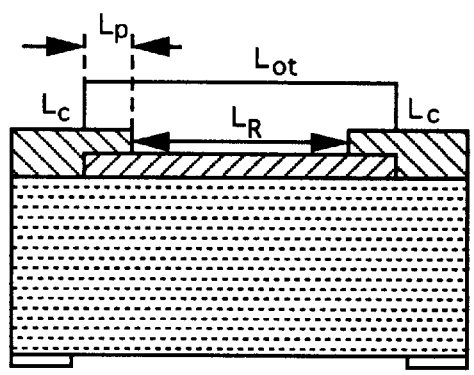
FIGS. 2A and 2B are two cross sectional views of a resistive elements showing the conductive layer and resistive layer being formed in different order according to the present invention and the prior art thus generating resistive elements of different lengths.
Figure 2B:
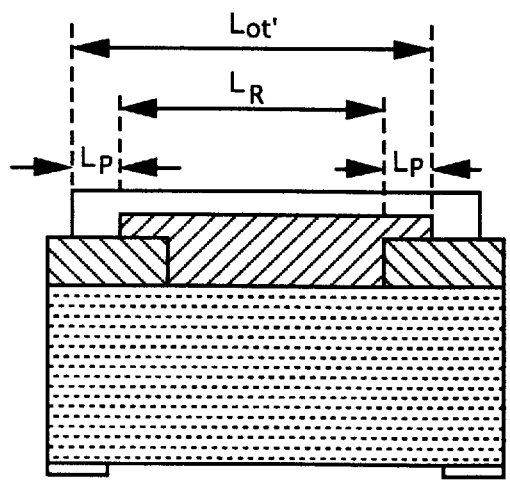

In order to keep the same length of Lr and Lc and to keep a minimum overlapping length Lp, the second resistive element according to a conventional manufacture process is longer by a length of 2Lp than the resistive element of the present invention as that shown in FIG. 2 and 2A.

Accordingly, the present invention discloses a resistive circuit. The resistive circuit includes a plurality of resistor networks disposed on a substrate 100. The resistor networks also includes a plurality of resistive circuit elements 120. The resistor networks further includes a plurality of termination contacts 118 each connected to one of the resistive circuit elements 120. Each of the termination contacts 118 is disposed on an edge of the substrate 100 and each of the termination contacts 118 is separated from a next termination contact by an edge trench 170 disposed on the edge of the substrate 100 whereby a distance across the edge trench 170 defining a pitch between the termination contacts 118. In the resistor networks 100, the resistive circuit element 120 composed of a resistive layer 210 and the termination contacts composed of a conductive layer 220 wherein the resistive layer 210 is disposed below the conductive layer 220.

Figure 3:
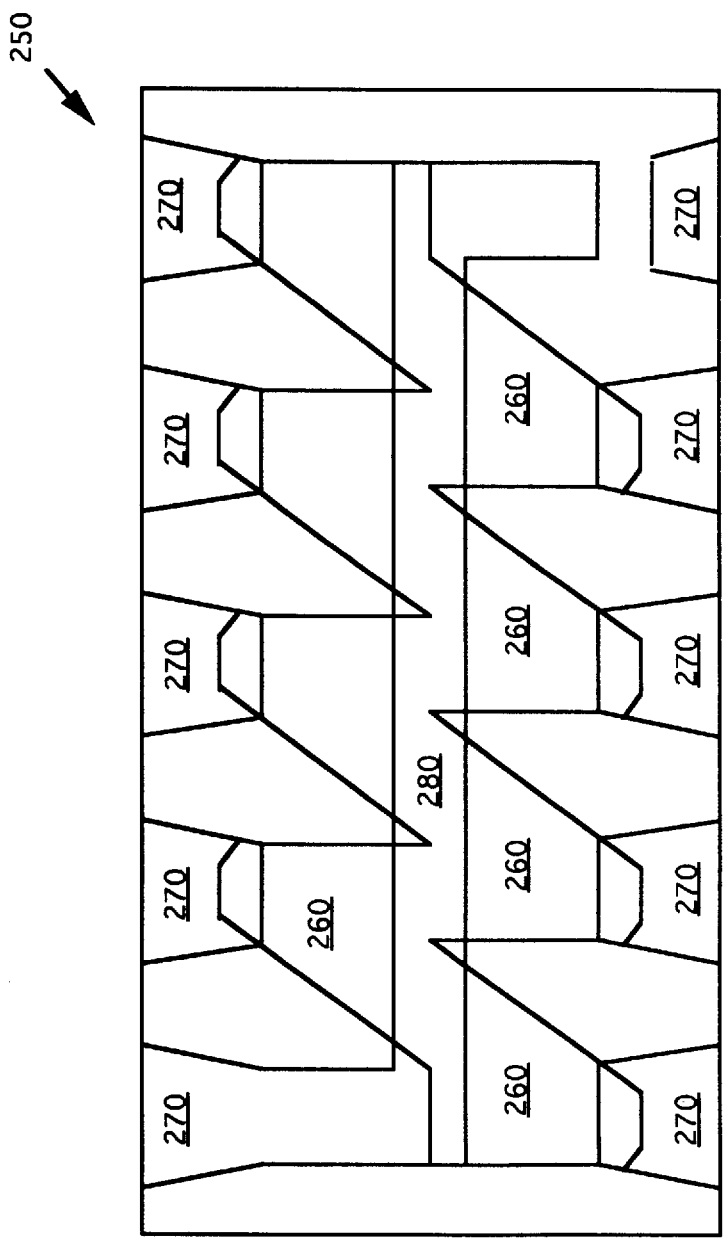
FIG. 3 is a circuit diagram showing a resistor network of the present invention.

FIG. 3 is a circuit diagram showing a preferred embodiment of a resistor network 250 which includes eight resistors 260 and ten contact terminals 270 with a common terminal line 280. The resistor network 250 can be manufactured by a thick film process with a resistive $RuO_2$ film to form the resistors 260 and a conductive AgPd film to form the terminal contact 270. The resistor network 250 is formed with the resistors 260 formed as a film below the contact terminal 270 composed of a conductive film as that shown in FIG. 2. The resistor network 250, including eight resistors and ten contact terminals, can be formed on a substrate with an area of 3.2 millimeters by 1.56 millimeters with a pitch of 0.64 millimeters. By applying the techniques disclosed in this invention, the sizes of the resistor network and the pitch can be further reduced conveniently. The dimension for the resistive circuit elements can be controlled such that a resistor occupies an area substantially smaller than 0.7 mm$^2$ on the substrate with the pitch between the terminal contact precisely formed by mechanically cutting the edge trenches using a dicing saw.

A new manufacture process and resistor network structure are provided in this invention which enable a person of ordinary skill in the art to overcome the difficulties encountered in the prior art. Specifically, a new manufacture process and a resistor network structure are disclosed wherein the pitch of the I/O termination contacts are controlled by mechanically cutting a plurality of separating trenches between the I/O contacts thus producing I/O contacts with a pitch defined by the width across the pitch. Furthermore, with this new manufacture process and resistor network structure, the resistor network can be further miniaturized and manufactured with higher density. Additionally, the new manufacture process and a resistor network structure can be manufactured with simplified packaging process thus greatly reducing production costs. Also, the resistor networks can be manufactured with simplified processing and packaging procedures such that the manufacture process can be conveniently automated.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A plurality of resistor networks disposed on a substrate comprising:

a plurality of resistive circuit elements;

a plurality of termination contacts each connected to one of said resistive circuit elements; and each of the termination contacts is disposed on an edge of said substrate and each of the termination contacts is separated from a next termination contact by an edge trench disposed on said edge of said substrate a with a final trench-cutting controllable distance defining a pitch between the termination contacts without thermal expansion uncertainties.

2. The resistor network of claim 1 wherein:

said final trench-cutting controllable pitch defined by said edge trenches ranging from approximately ten mils to about fifty mils.

3. The resistor network of claim 1 wherein:

said resistive circuit element composed of a layer of NiCr and said termination contacts composed of a layer of conductive NiCu.

4. The resistor network of claim 1 wherein:

said resistive circuit element composed of a resistive layer and said termination contacts composed of a conductive wherein said resistive layer is disposed below said conductive layer.

5. The resistor network of claim 2 wherein:

each of said resistive circuit elements occupies an area substantially smaller than 0.7 mm$^2$ on said substrate.

6. A plurality of resistor networks disposed on a substrate comprising:

a plurality of resistive circuit elements wherein each of said resistive circuit elements composed of a resistive layer;

a plurality of termination contacts each composed of a conductive layer and connected to one of said resistive circuit elements wherein said resistive layer is disposed below said conductive layer; and each of said termination contacts is disposed on an edge of the substrate and each of said termination contacts is separated from a next termination contact by an edge trench having a final trench-cutting controllable distance ranging from approximately ten mils to about fifty mils disposed on said edge of said substrate whereby said final trench-cutting controllable distance across said edge trench defining a pitch between said termination contacts without thermal expansion uncertainties.

7. The resistor network of claim 6 wherein:

said resistive circuit element composed of a layer of NiCr and said termination contacts composed of a layer of conductive NiCu.

8. The resistor network of claim 6 wherein:

each of said resistive circuit elements occupies an area substantially smaller than 0.7 mm$^2$ on said substrate.

9. A method for fabricating a plurality of resistor networks on a substrate with each of said network connected to a termination contact on said substrate, the method comprising steps of:

(a) forming a plurality of resistive films and conductive films on said substrate;

(b) patterning the resistive films into a plurality of resistive circuit elements and a plurality of termination contacts, each connected to one of said resistive circuit elements;

(c) cutting said substrate along a cutting edge with the cutting edge near a plurality of termination contacts; and (d) cutting a plurality of edge trenches along said cutting edge each of said edge trenches is cut between the termination contacts thus separating said termination contacts with a predefined final trench-cutting controllable pitch across the edge trenches whereby a precision control of the pitch can be controlled same as a precision control of cutting the edge trenches without thermal expansion uncertainties.

10. The method for fabricating the resistor networks of claim 9 wherein:

the step (b) of patterning the resistive films into a plurality of resistive circuit elements and a plurality of termination contacts, further including a step of performing a high temperature process for annealing and stabilizing the resistive circuit elements and the termination contacts.

11. The method for fabricating the resistor networks of claim 9 wherein:

the step (a) forming a plurality of resistive films and conductive films on said substrate is a step of forming said resistive film below said conductive films.

* * * * *